United States Patent
Lam et al.

(10) Patent No.: US 9,566,927 B2
(45) Date of Patent: Feb. 14, 2017

(54) SYSTEM AND METHOD FOR DETECTING HEAT EMITTING OBJECTS

(71) Applicant: CITY UNIVERSITY OF HONG KONG, Hong Kong (CN)

(72) Inventors: Tik Hang Lam, Hong Kong (CN); Rui-qin Zhang, Hong Kong (CN)

(73) Assignee: City University of Hong Kong (CN)

( * ) Notice: Subject to any disclaimer, the term of this patent is extended or adjusted under 35 U.S.C. 154(b) by 621 days.

(21) Appl. No.: 13/716,610

(22) Filed: Dec. 17, 2012

(65) Prior Publication Data

US 2014/0169404 A1    Jun. 19, 2014

(51) Int. Cl.
G01K 7/04     (2006.01)
B60R 21/015   (2006.01)
B60N 2/00     (2006.01)
H03K 17/945   (2006.01)

(52) U.S. Cl.
CPC ......... B60R 21/01512 (2014.10); B60N 2/002 (2013.01); H03K 17/945 (2013.01)

(58) Field of Classification Search
CPC ...................................................... B60N 2/002
USPC ........................ 374/E17.001, 179, 29; 4/322
See application file for complete search history.

(56) References Cited

U.S. PATENT DOCUMENTS

| | | | | |
|---|---|---|---|---|
| 6,556,137 B1 * | 4/2003 | Oka | ........................ | B60N 2/002 280/735 |
| 7,036,390 B2 * | 5/2006 | Tsuchihashi | ......... | A61B 5/0507 73/865.9 |
| 7,134,715 B1 * | 11/2006 | Fristedt | .................. | B60N 2/002 177/144 |
| 2002/0080014 A1 * | 6/2002 | McCarthy | .............. | B60N 2/002 340/426.1 |
| 2004/0150417 A1 * | 8/2004 | Paulos | .................... | H01L 23/34 374/178 |
| 2005/0098640 A1 * | 5/2005 | Ichishi | ............... | B60H 1/00742 236/49.3 |
| 2005/0140189 A1 * | 6/2005 | Bajic | .................... | B60N 2/5635 297/180.1 |
| 2007/0251016 A1 * | 11/2007 | Feher | ....................... | A47C 7/74 5/713 |
| 2008/0271231 A1 * | 11/2008 | Stauber | ................ | A47K 13/305 4/246.1 |
| 2009/0121524 A1 * | 5/2009 | Abe | ........................ | A47C 7/748 297/180.1 |
| 2010/0154855 A1 * | 6/2010 | Nemir | ..................... | H01L 35/34 136/205 |
| 2011/0115635 A1 * | 5/2011 | Petrovski | ............. | A47C 21/048 340/584 |

* cited by examiner

*Primary Examiner* — Lisa Caputo
*Assistant Examiner* — Nasir U Ahmed
(74) *Attorney, Agent, or Firm* — Heslin, Rothenberg, Farley & Mesiti PC; Melvin S. Li

(57) ABSTRACT

There is provided a system for detecting presence or absence of a heat emitting object, comprising a platform for receiving the object, and the platform defining an area in which a temperature gradient with the object may exist, a thermoelectric device for generating an electrical voltage indicative of the presence or absence of temperature gradient and/or the magnitude of the temperature gradient, and an indicator for indication of the presence or absence of the object to be detected.

12 Claims, 15 Drawing Sheets

SYSTEM AND METHOD FOR DETECTING HEAT EMITTING OBJECTS

FIELD OF THE INVENTION

The present invention is concerned with a system and a method for detecting presence or absence of heat-emitting objects, such as a system based on thermoelectric effect for detecting presence or absence of heat-emitting objects.

BACKGROUND OF THE INVENTION

There are different systems in the market for detecting presence or absence of objects. For example, some of these systems are for security use and make use of motion detection devices. Some other systems make use of mechanical sensing techniques. In these other systems, pressure sensors or inductive-capacitive proximity sensor would be used. While these sensors are effective to some extent, they suffer from a number of limitations. For example, they tend to have shorter life span. Further, pressure sensors cannot distinguish between whether an object detected is a person or merely a non-living object. For inductive-capacitive sensors, they are typically (electrical) energy consuming and would complicate their applications. Yet further, many of the existing sensing technologies may not be suitable for use in busy or crowded areas. For inductive-capacitive proximity sensors, the use of electrodes is typically required. However, if the inductive-capacitive proximity sensor is accidentally exposed or earthed, e.g. when water is present, the detection will become inaccurate. Also, the electromagnetic field generated by such sensor may be interfered by external field surrounding it.

The present invention seeks to address the above issues or at least to provide a useful alternative to the public.

SUMMARY OF THE INVENTION

According to a first aspect of the present invention, there is provided a system for detecting presence or absence of a heat emitting object, comprising a platform for receiving the object, the platform defining an area in which a temperature gradient with the object may exist, a thermoelectric device for generating an electrical voltage indicative of the presence or absence of temperature gradient and/or the magnitude of the temperature gradient, and an indicator for indication of the presence or absence of the object to be detected. The thermoelectric device may act as a sensor for detection of the temperature gradient.

Preferably, the thermoelectric device may comprise one p-n diode or an array of p-n diodes, the diode(s) may be adapted to convert thermal power to electrical power for signal generation.

Suitably, the system may comprise a power amplifier for amplifying signals generated by the sensor and/or the thermoelectric device.

Advantageously, the system may comprise means for logging signals and data generated by the sensor and/or the thermoelectric device. The system may be loaded with a computer program for processing data generated by the sensor and/or the thermoelectric device for ascertaining the presence or absence of the temperature gradient and/or the magnitude of the temperature gradient, and determining the presence or absence of the object.

The sensor may comprise the use of a thermal electric generator made of a thermoelectric material.

The electrical voltage generated by the thermoelectric device may range from substantially 4 mV to 70 mV in specific embodiments. The electrical voltage may actually be much greater, especially when the system is provided with a voltage amplifier. However, detection of larger voltage is generally not technically problematic.

In a first embodiment of the system, the system may be a vehicle and the platform may be a passenger seat in the vehicle for receiving a passenger, wherein the sensor may be arranged at a location of the seat with which a passenger sitting on the seat is in thermal contact in use, thus creating a temperature gradient between the passenger and the seat. The location may be where the passenger's thighs and/or hip is/are in contact with the seat in use. The indicator may be arranged on the exterior of the vehicle visible by prospective passengers. The indicator may be an independent display means but operably linked to the thermoelectric device, providing information on occupancy status of the vehicle.

In a second embodiment of the system, the system may be a public washroom facility system. In a specific embodiment, the platform may be a toilet seat of a toilet bowl, and the sensor may be arranged at a location of the toilet seat with which a user is in thermal contact in use, thus creating a temperature gradient between the user and the toilet seat. In another specific embodiment, the platform may be a urinal, and the sensor may be arranged at a location of the urinal with which a user is in thermal contact in use, thus creating a temperature gradient between the user and the urinal in use. It is to be noted that in the context of this invention, the term "platform" has a broad meaning, and refers to a structure with which a user or something from the user may have a temperature gradient.

In a third embodiment of the system, the system may be a gas stove. The platform may be a support structure on which an article of cookware rests during cooking. In such embodiment, the sensor may be arranged at a location distant from the article of cookware on the support structure during cooking in use, and adapted to detect temperature gradient between the article of cookware and the sensor. The system may comprise means for monitoring flow of gas to the gas oven during use. The system may comprise means for monitoring and comparing data generated by the sensor and/or the thermoelectric device, and the gas flow monitoring means in use. The system may comprise means for shutting off supply of gas to the gas stove when abnormality with respect to gas flow and temperature gradient is detected.

According to a second aspect of the present invention, there is provided a method of operating a system as described above.

According to a third aspect of the present invention, there is provided a signal switching and control system operably coupled with a detection system as described above.

According to a third aspect of the invention, there is provided a method of detecting presence or absence of heating emitting objects, comprising the steps of a) providing a platform for receiving the object, the platform defining an area in which a temperature gradient with the object may exist, b) providing a sensor for detecting the temperature gradient, and c) providing a thermoelectric device for generating an electrical voltage indicative of the presence or absence of temperature gradient and/or the magnitude of the temperature gradient.

BRIEF DESCRIPTION OF THE DRAWINGS

Some embodiments of the present invention will now be explained, with reference to the accompanied drawings, in which:—

DETAILED DESCRIPTION OF PREFERRED EMBODIMENTS OF THE INVENTION

Figure 1:
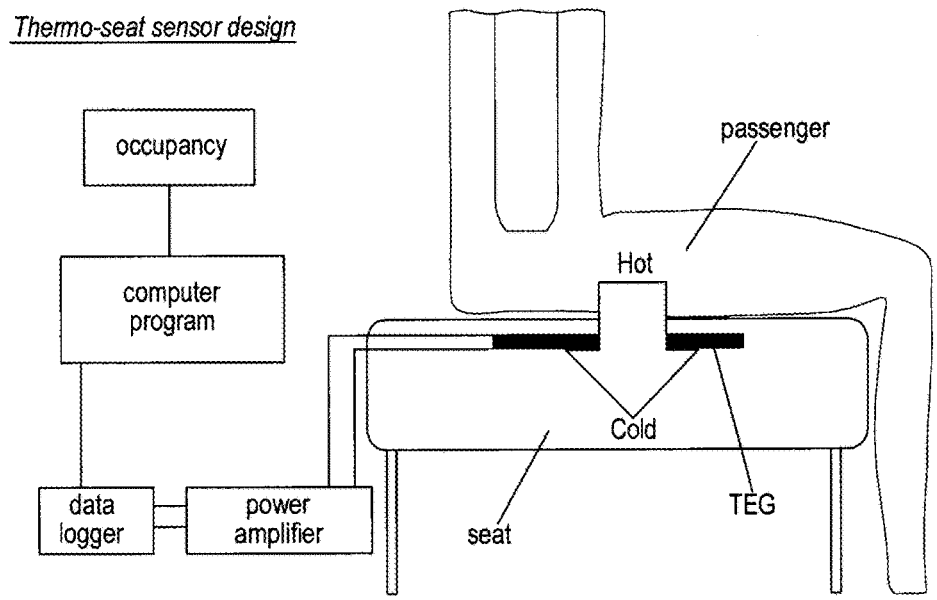
FIG. 1 is a schematic diagram illustrating an embodiment of an arrangement of a system according to the present invention.

Some aspects of the present invention make use of thermoelectric sensors in detecting presence or absence of heating emitting objects. Such sensors may take the form of thermoelectric devices or in specific embodiments in the form of "thermo-seat sensors" for use on seats, for signal switching and control. A thermoelectric sensor generally makes use of the properties of thermoelectric materials for converting thermal variations to electrical signals. In certain embodiments, the invention may be applied in a system for the detection of the presence or absence of passengers or generally the occupancy status of a vehicle, bus or subway train. In use, the thermoelectric material of the sensors is placed at the seats of the vehicle. The position of the sensors is such that in use the sensors are in physical or at least thermal contact with passengers sitting on the seats. In an embodiment, the "cold side" of the thermoelectric material faces towards the seat and the "hot side" of the thermoelectric materials faces towards the body of the sitting passengers. It can be understood that the thermoelectric material of the sensors can convert heat energy (thermal power) from the passenger to electrical energy (voltage) when for example heat flows from the body of a passenger to the seat supporting the passenger. The detection system includes a data logger connected to the thermoelectric sensor for receiving the electrical voltage generated from thermoelectric material as a function of time. When there is for instance a rapid increase of electrical voltage, for example when registered by the data logger, it typically means there is heat flowing from the hot side to the cold side of the thermoelectric device, which is indicative of a passenger having just sat down. After a passenger has sat down on the seat, the flowing of heat from the passenger will reach a maximum value. After the voltage generated has reached a maximum value, the voltage generated will gradually decrease (decay) to a lower voltage until this lower value has become relatively constant. The data logger will then receive a constant positive voltage value when the heat flow comes to a dynamic equilibrium. When the passenger leaves the seat such that s/he is no longer in contact with the seat, the heat from the seat will flow to the opposite direction from the seat (previously cold-side) to the surrounding (previously hot-side). When this occurs, the voltage generated will decrease rapidly to a negative value and the data logger will again receive a rapid change of voltage. The negative value is indicative that the seat is now empty and is available. For clarity reason, it is to be noted that in the context of this invention, "contact" has relatively broad meaning and generally refers to physical and/or thermal contact. Please see FIG. 1.

One element of the present invention is concerned with the selection of the material, or more specifically the thermoelectric material. While the choice of thermoelectric material in making the sensing means is important, in the context of the present invention the sensitivity of the sensor when used on a seat for detection of occupancy of the seat by passenger does not necessarily have to be very high. This is because there is no need to sense or detect small changes in temperature fluctuations—the thermal gradient between a passenger and the seat that the passenger has sat on is usually relatively large. This is in fact an advantage, at least commercially, in that even a lower sensitivity of a thermoelectric sensor or lower specification of the sensor would still allow relatively accurate detection. It is also to be noted that the temperature range of the thermoelectric material is not required to be very large because the temperature difference between the human body (passenger) and the surroundings (including, e.g. the seat) is not that large, and is typically from around 10 to 20° C. Accordingly, the use of a thermoelectric material with a relatively narrow temperature range (of capacity) can still yield a relatively sharp and precise signal. In the application when a seat is provided with a thermoelectric sensor, the thermal conductivity of (the material of) the seat can also affect the sensitivity of the sensor. For a seat made with a material of higher thermal conductivity, heat can more easily flow to the sensor, resulting a more sensitive response and a reduced time lag of detection.

The following demonstrates different embodiments of the present invention by way of experiments, examples and discussions.

EXPERIMENTS

A series of experiments was carried out. The experiments were to study the behavior of detection of occupancy of a seat and different aspects or conditions of occupancy detection.

Background and Conditions

Experiment 1

In this experiment, the location of a thermoelectric sensor on a seat was studied in order to ascertain the desired position of the sensor on the seat. Specifically, studies were carried out to determine the relationship of the location of the sensor and the (magnitude of) signal received. It was determined that the sensor should be placed on a location of the seat where during sitting by a passenger, the body of the passenger and the sensor would be in good contact. Two positions of the sensor were studied.

Figure 2A:
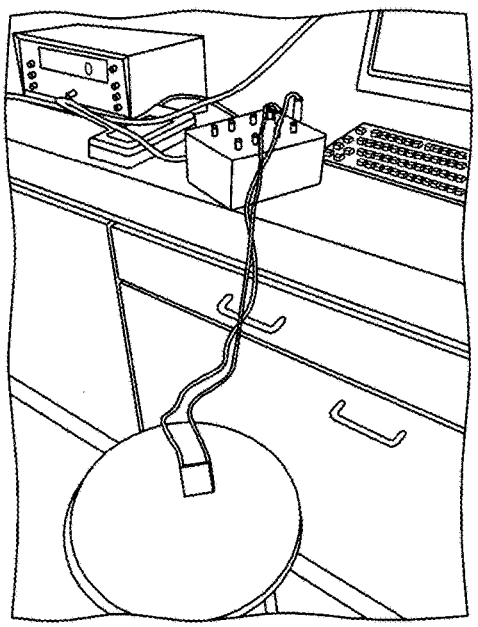
FIG. 2a is a photograph showing the location of a thermoelectric sensor arranged on the surface of a seat.

Position 1: Sensor located on the seat and being in contact with the hip of the passenger in use
Position 2: Sensor located on the seat and being in contact with one of the thighs of the passenger in use FIG. 2a shows how the sensor was arranged on a seat during the experiment. It is shown that the sensor was always in full contact with the seat when a user (or passenger) was sitting on the seat. In other words, regardless of whether the sensor was placed in position 1 or 2, it was in contact with the hip or thigh of the user during the experiment, in order to maximize heat recipient by the sensor.

Experiment 2

Figure 2B:
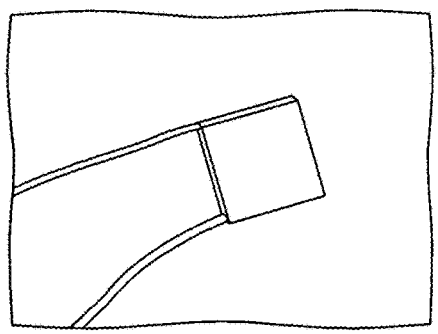
FIG. 2b is a photograph showing one model of a thermoelectric sensor arranged on the surface of a seat.
Figure 2C:
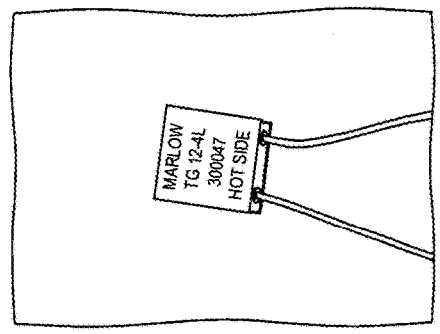
FIG. 2c is a photograph showing another model of a thermoelectric sensor arranged on the surface of a seat.

In this experiment, tests were carried out to study the thermoelectric efficiency of the material of a thermoelectric generator, since the choice of material of the sensor might affect the sensitivity. Two types of thermoelectric materials were used in the tests, namely TEC 12703 (manufactured by Hangzhou Aurin Cooling Device Co. Ltd.) and MARLOW TG 12-4L (manufactured by Marlow Industries, Inc.). The behavior of heat flowing and (voltage) electricity generation by these thermoelectric materials was compared under the same conditions. The thermoelectric material that gave larger and/or more stable electrical signal at the same temperature setup was chosen for further analysis in the next stage. Please see FIG. 2b and FIG. 2c, respectively. The following table summarizes the specification of these two sensors.

TABLE 1

| TEC 12703 (5 cm × 5 cm) | MARLOW TG 12-4L (4 cm × 4 cm) |
|---|---|
| Maximum Temp (° C.): 67 | Maximum Temp (° C.): 250 |
| — | Efficiency (%): 4.97 |
| Power (W): 29.7 | Power (W): 4.05 |
| VOC (V): 12 | VOC (V): 9.45 |
| Resistance (Ω): 3.3-4.3 | Resistance (Ω): 5.1 |
|  | Seebeck coefficient (mV/° C.): 7.78 |
|  | Thermal Resistance (° C./W): 2.21 |

Experiment 3

Figure 3:
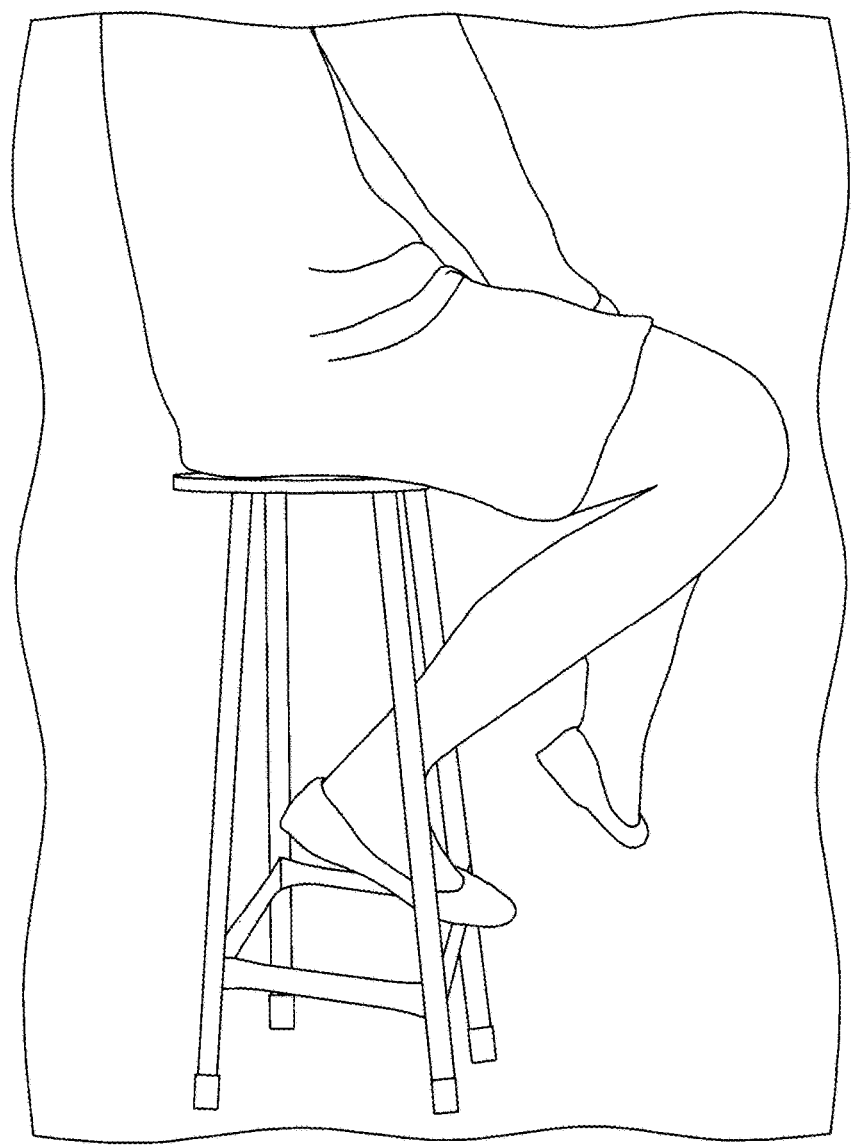
FIG. 3 is a photograph showing a seat provided with a thermoelectric sensor and with a person sitting on the seat.

The thermoelectric sensor arranged on the seat was basically to detect the heat flow between the seat and the surroundings, whether or not the seat is occupied by a passenger. In order to understand the behavior of the sensor under different sitting or occupancy conditions, this experiment was to analyze a seat made of a wooden material in the following different conditions. Please see FIG. 3.

1. change of voltage before sitting
2. change of voltage after sitting
3. change of voltage after sitting for a period of time
4. change of voltage when standing up after sitting
5. change of voltage after sitting down right after standing up
6. change of voltage after standing up for a prolonged period of time Experiment 4

This experiment was to study the lag time of the sensor and the threshold temperature gradient of the sensor.

Knowledge of the lag time would be useful in adjusting the system such that it would be able to detect occupancy conditions, e.g. when there were frequent occupying the seat and frequent departing from the seat. The threshold temperature gradient of the sensor would be useful to study the range of the threshold temperature gradient that the sensor could detect, i.e. the smallest and the largest temperature gradients that the sensor can detect. This information would assist the choice of thermoelectric material that could be used in the context of detection system for occupancy status of a public transportation system.

These experiments were carried out in a laboratory, in that one man and one lady were invited as the users (passengers). A wooden seat was used as the seat (platform) for receiving the passenger. During the experiments, the room temperature in the laboratory was 24.6±0.1° C. and the temperature of the wooden seat (before the experiments began and when unoccupied) was 25.5±0.1° C.

Results

Experiment 1

Figure 4:
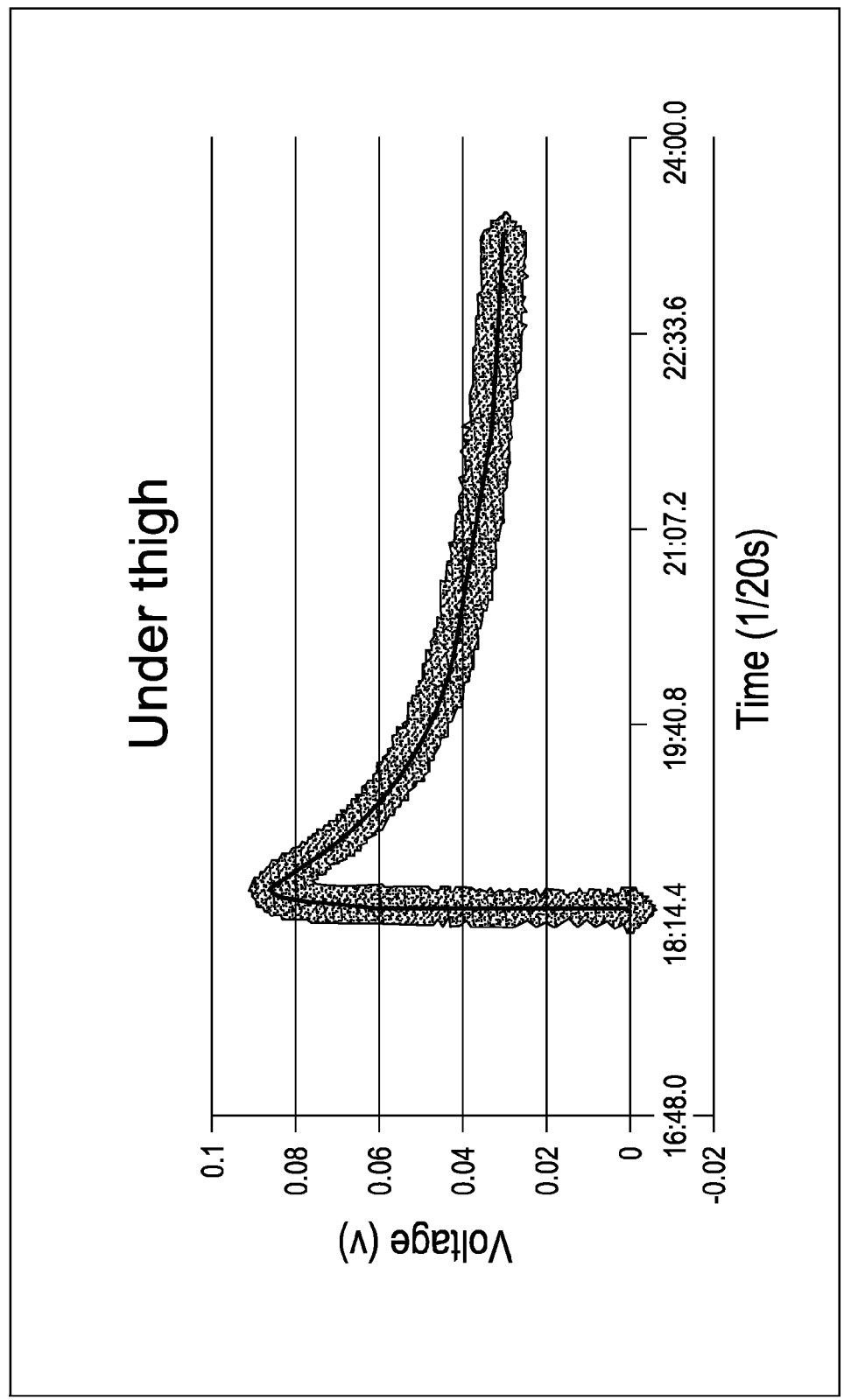
FIG. 4 is a graph showing the relationship between voltage generated by a thermoelectric sensor and time when the sensor is arranged at a location of a seat at which the thighs of a user being in contact with the sensor in use.

The thermoelectric material (TEC 12703) was used to test the optimal or at least a workable position for the thermo-seat sensor on the seat. Specifically, voltage generated by the sensor was measured during the experiment. A data logger was used and the sampling rate of the data logger was set to be 20 $s^{-1}$. The measuring duration of time was set to 5 minutes. The sensor was placed on a location of the seat such that a user's thigh would be in contact with the sensor during sitting. In other words, the sensor was situated between the user's thigh and the seat/seat surface. FIG. 4 is a graph showing the relationship of the voltage generated by the sensor of the thermoelectric material (TEC 12703) being placed between the top surface of the seat and the position of the thigh.

Figure 5:
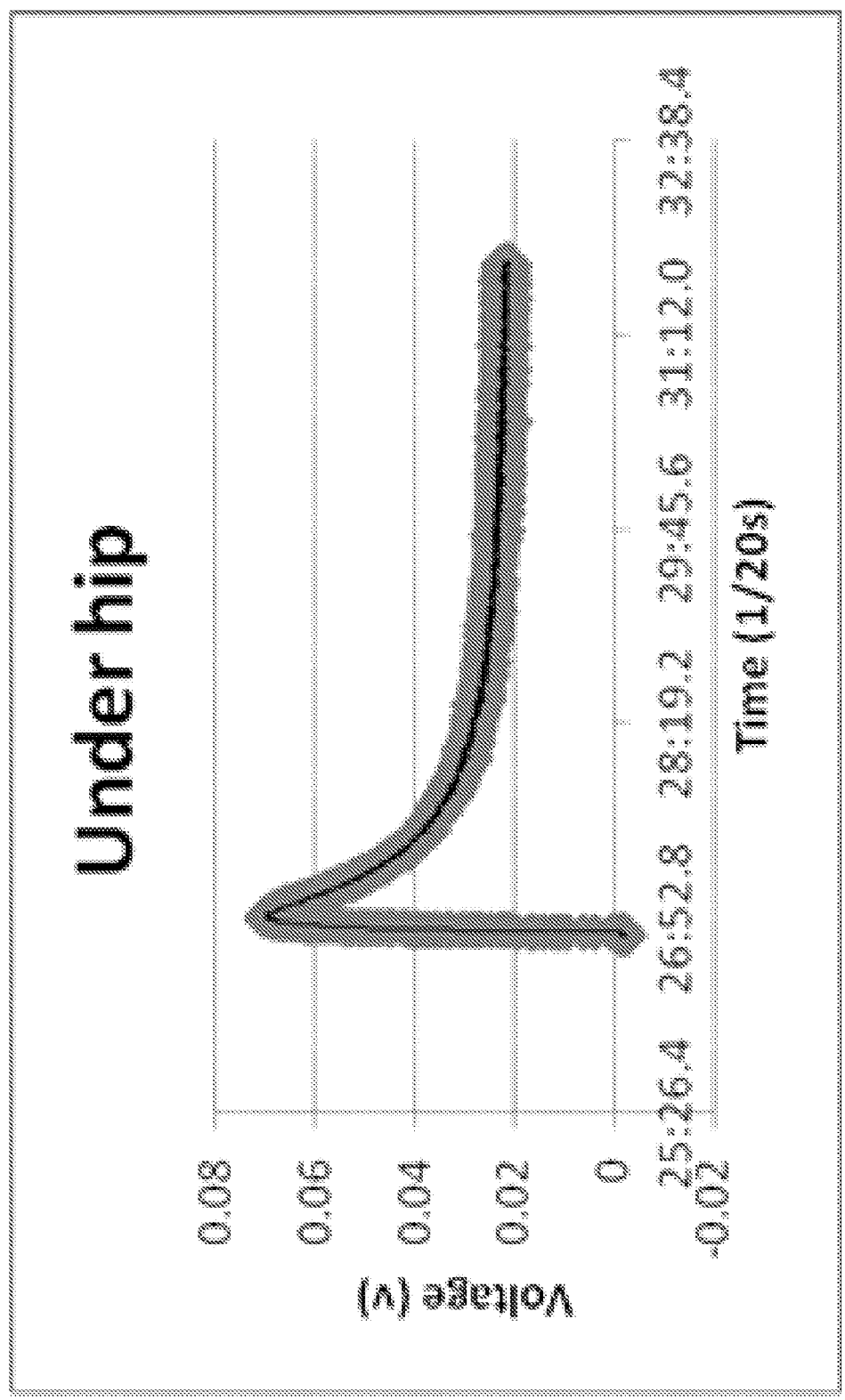
FIG. 5 is a graph showing the relationship between voltage generated by a thermoelectric sensor and time when the sensor is arranged at a location of seat at which the hip of a user being in contact with the sensor in use.

A corresponding test was run for comparison. In the corresponding test, the sensor was placed on a location of the seat such that a user's hip would be in contact with the sensor during sitting. FIG. 5 is a graph showing the relationship of the voltage generated by the sensor of the thermoelectric material (TEC 12703) being placed between the top surface of the seat and the position of the hip.

As shown in FIG. 4 and FIG. 5, the voltage generated from the sensor of thermoelectric material (TEC 12703) at the two positions (namely thigh position and hip position) were more or less the same. Accordingly, a detection system would work as long as the position of the seat sensor allows the body of the user (passenger) being in touch or in thermal contact with the sensor.

Experiment 2

Figure 6:
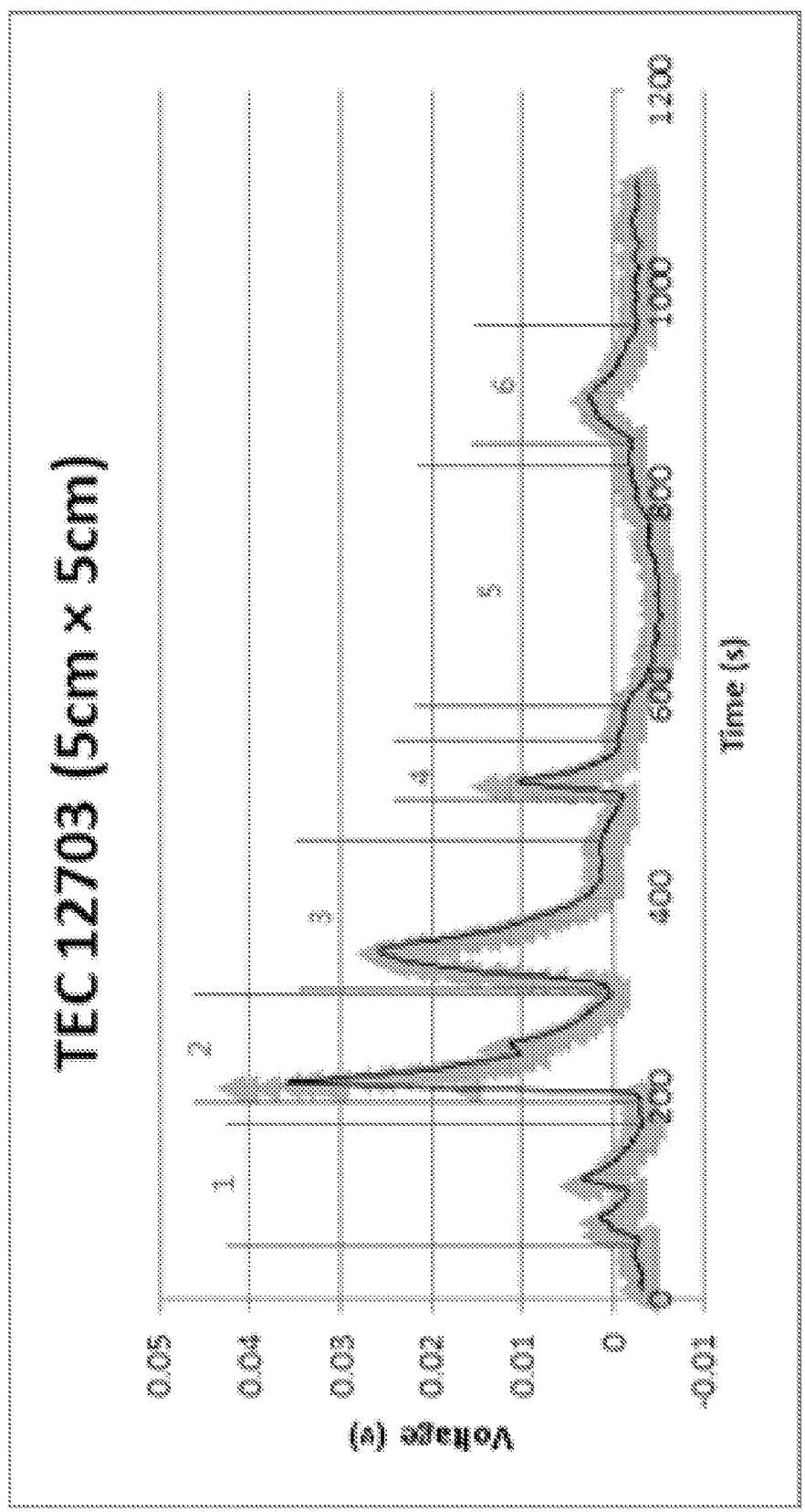
FIG. 6 is a graph showing voltage generated by a thermoelectric sensor (model no. TEC 12703) when the sensor is in contact under a series of different stages.
Figure 7:
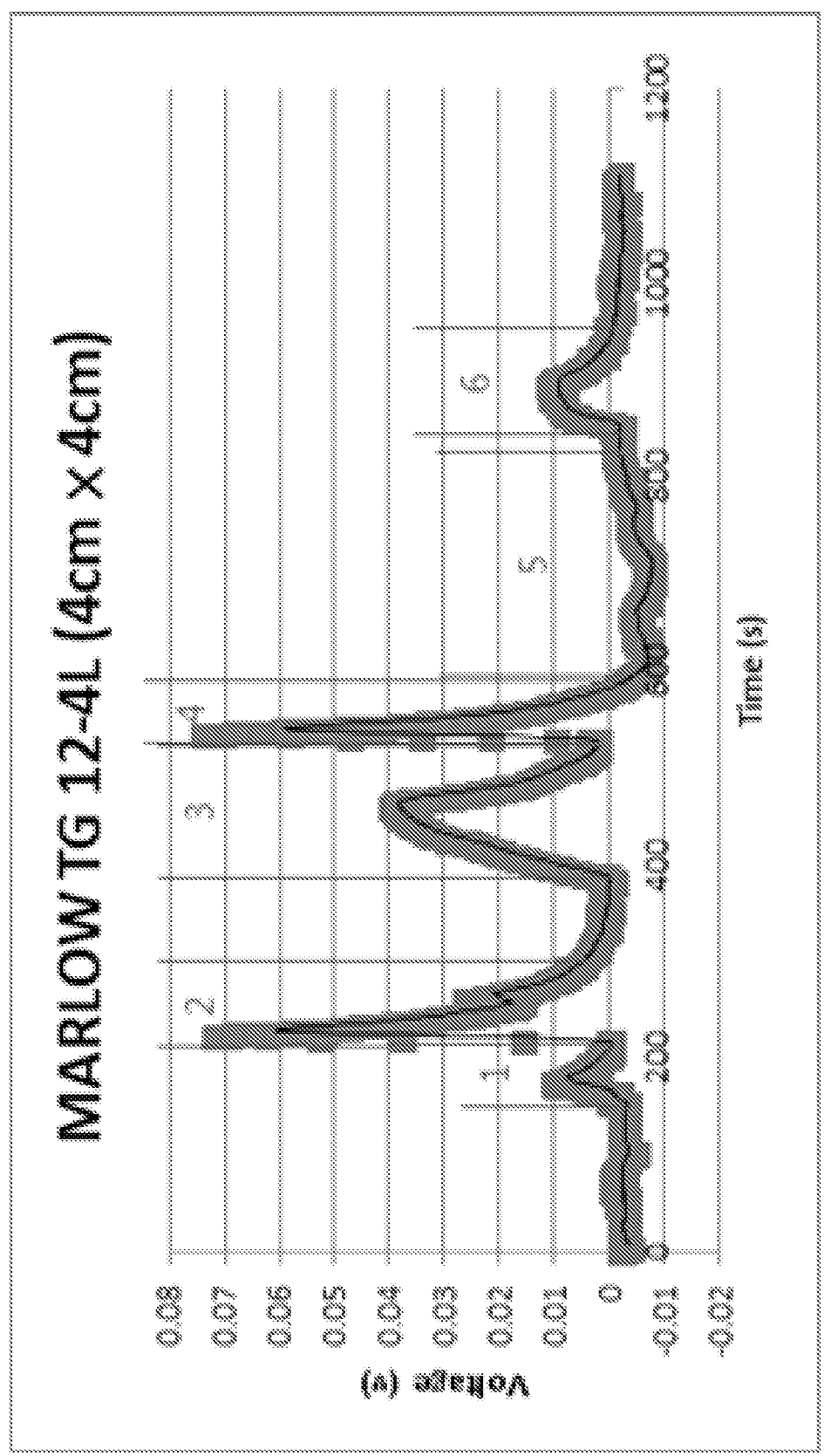
FIG. 7 is a graph showing voltage generated by a thermoelectric sensor (model no. MARLOW TG 12-4L) when the sensor is in contact under a series of stages.

FIG. 6 and FIG. 7 show the thermo-electrical efficiency of two materials under a series of contact conditions. As discussed above, the two materials used were TEC 12703 (5 cm×5 cm) and MARLOW TG 12-4L (4 cm×4 cm). The numerical labels in the figures represent contact by different body parts or objects under different conditions during the tests. Please see below labels for reference.

1. Finger touching
2. Knee touching

3. Calf touching
4. Blowing air to sensor
5. Wind
6. Back of palm touching

The figures show that the voltages generated under the condition of finger touching on the sensors are about 4 mV to 10 mV, which are relatively small compared to the voltage generated by the condition of sitting (about 100 mV, see FIGS. 4 and 5). Despite the relatively small detected voltage, both types of thermoelectric generating materials (TEGs) were able to respond to such fast action of finger touching, indicating that their sensitivity is satisfactorily high.

The voltages generated, as a result of touching by the knee and the calf of the passenger, are about 24-40 mV and 40-70 mV, respectively. These values are larger, presumably due to the larger surface areas of these body parts, and also their warmer surface when compared to fingers.

When blowing air to the sensor, an unexpectedly larger positive value of the voltage for both types of TEGs was resulted. It is indicative that the TEGs are sufficiently sensitive to detect warm air from expiration.

Study was also carried out to show the effect of wind to the sensors. As shown in the figures, the value of the voltage is negative, indicating that heat flowed away from the sensors on the seat.

Finally, the back of the palm was placed on the sensors on the seat. A small positive value of 4 mV to 10 mV was generated.

As shown above, the voltages generated by MARLOW TG 12-4L (4 cm×4 cm) in most cases were higher than that of the TEC 12703 (5 cm×5 cm). This means that the MARLOW sensor is more sensitive than the TEC sensor. FIG. 7 also suggests that not much noise was detected by the MARLOW sensor. However, there was more fluctuation, or noise, detected by the TEG sensor.

When comparing FIG. 6 and FIG. 7, it is shown that the peak voltage generated by the MARLOW sensor was higher and sharper under similar conditions, indicating that the MARLOW sensor can give a sharper and clearer signal than the TEC 12703 (5 cm×5 cm).

When comparing FIG. 6 and FIG. 7 with respect to the lag or response time of the two TEG sensors, similar response times were shown, indicating that they both were quick in response to temperature changes.

Overall, the MARLOW sensor is more sensitive to change of temperature and gives a fairly stable signal in thermal sensing.

In the following experiment, the MARLOW sensor was mainly used in further specific studies.

Figure 8:
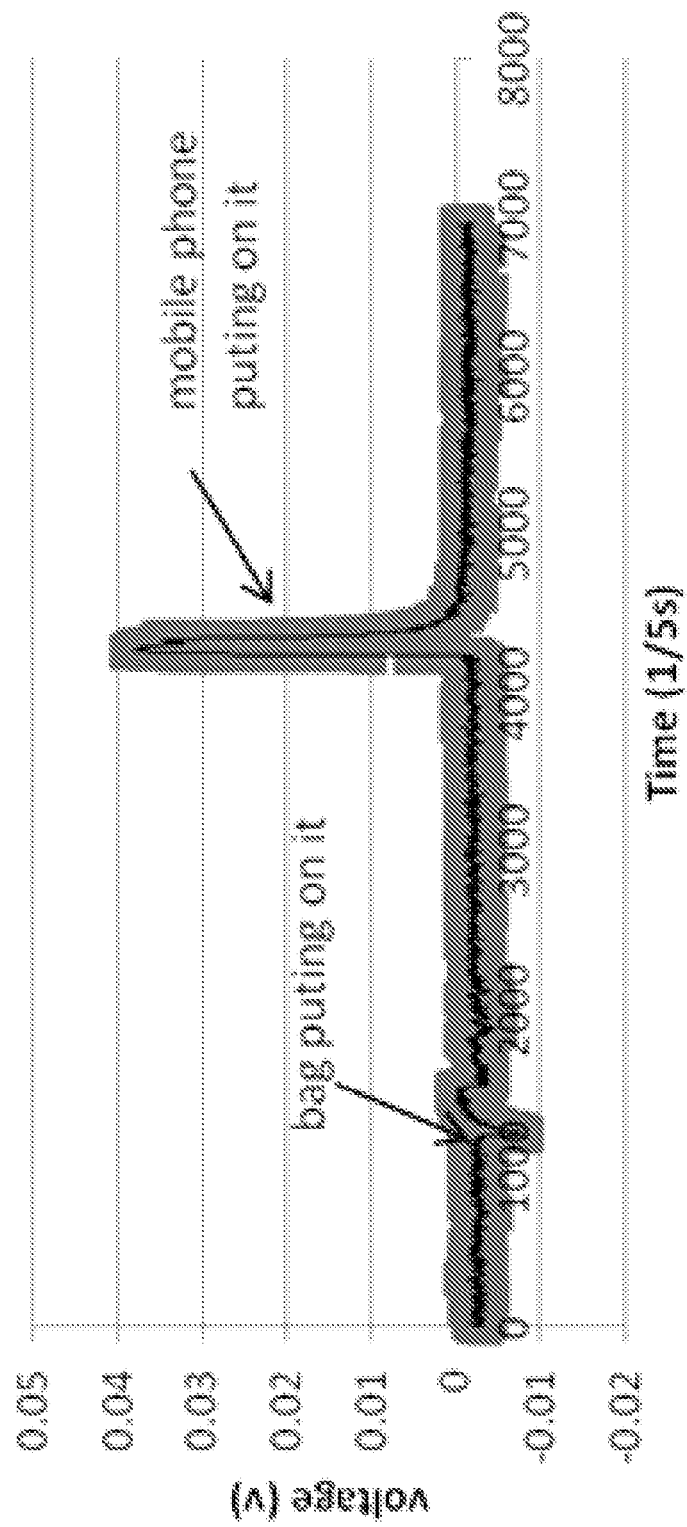
FIG. 8 is a graph showing voltage generated by a thermoelectric sensor (model no. MARLOW TG 12-4L) when the sensor is under two different contact conditions.

FIG. 8 shows the voltage generated by the MARLOW sensor when a bag was placed on the seat and then when a mobile phone was placed on the seat. When the bag was placed on the seat, the voltage dropped, indicating that heat flowed away from the sensor on the seat. However, when the mobile phone was placed on the sensor, there was a positive increase in voltage, indicating that there was heat flowing from the mobile phone to the seat. These results were not unexpected because the bag was colder in temperature and the mobile phone (having turned on) was warmer than the seat, and the sensor detected this and gave signals. Although the signals (about 10 to 40 mV) were generated when non-living objects were placed on the sensor, the signals were not as strong as that generated by human body (about 100-160 mV).

Experiment 3

Condition A

Figure 9:
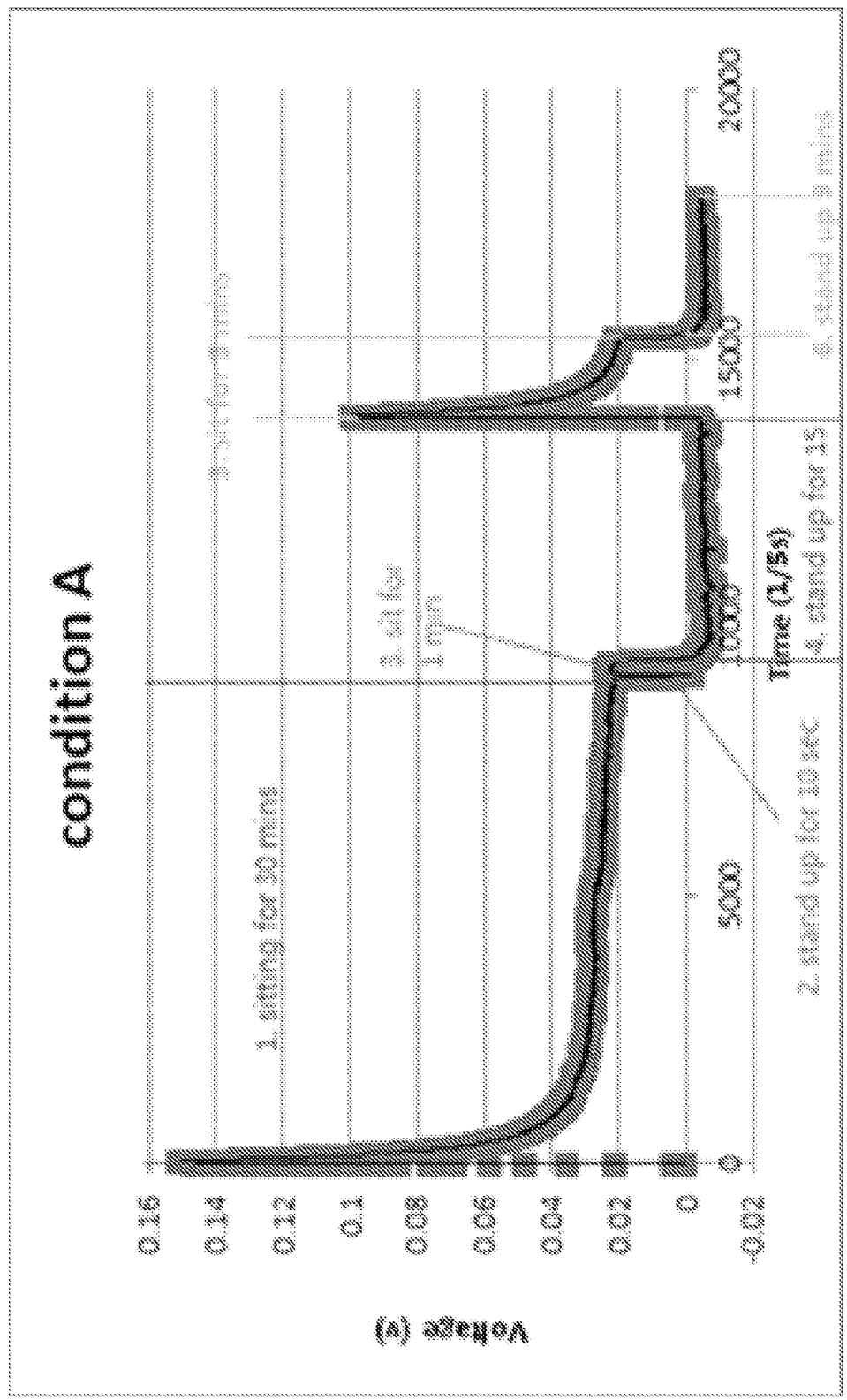
FIGS. 9 to 14 are a series of graphs showing voltage generated by a thermoelectric sensor (model no. MARLOW TG 12-4L) over a period of time during which the sensor is under different contact conditions, namely conditions A to F.

This experiment was conducted in a car. There were six stages in the experiment lasting for a total of about 1 hour. The seat in the car was occupied by a male passenger for 30 minutes. Then the male stood up for a few seconds. Then a female passenger occupied the seat for 1 minute and then stood up. The seat was left empty for 15 minutes. Then a male passenger occupied the seat again for 5 minutes. Then he stood up and left the seat empty for 9 minutes. The TEG used was MARLOW TG 12-4L. FIG. 9 shows the voltage generated by the sensor over the 1-hour period. The following table shows the values of voltage change during the different stages.

TABLE 2

| Action of each stage | ΔV |
| --- | --- |
| *Just sit down | $(0.15 - 0.00)/3 = (0.050 \pm 0.001)$ Vs$^{-1}$ |
| Sitting for 30 mins. | $(0.02 - 0.15)/1800 = (-0.0001 \pm 0.00002)$ Vs$^{-1}$ |
| *Just standing up | $(-0.005 - 0.02)/1 = (-0.025 \pm 0.0001)$ Vs$^{-1}$ |
| Standing up for 10 sec. | $(0.000 - (-0.005))/10 = (0.0005 \pm 0.00001)$ Vs$^{-1}$ |
| *Just sitting down | $(0.025 - 0.000)/1 = (0.025 \pm 0.001)$ Vs$^{-1}$ |
| Sitting for 1 min. | $(0.02 - 0.025)/60 = (0.000083 \pm 0.000001)$ Vs$^{-1}$ |
| *Just standing up | $(-0.008 - 0.02)/1 = (-0.028 \pm 0.001)$ Vs$^{-1}$ |
| Standing up for 15 mins. | $((-0.001) - (-0.008))/900 = (0.0000077 \pm 0.0000001)$ Vs$^{-1}$ |
| *just sitting down | $(0.1 - (-0.001))/2.5 = (0.0404 \pm 0.0001)$ Vs$^{-1}$ |
| Sitting down for 5 mins. | $(0.02 - 0.1)/300 = (-0.00027 \pm 0.00001)$ Vs$^{-1}$ |
| *just standing up | $(-0.008 - 0.02)/1 = (-0.028 \pm 0.001)$ Vs$^{-1}$ |
| Standing up for 9 mins. | $((-0.003) - (-0.008))/540 = (0.0093 \pm 0.0001)$ mVs$^{-1}$ |

Condition B

This experiment was likewise conducted in a car. There were four stages in the experiment. During the first stage, the seat was occupied by a male passenger for 15 minutes. In the second stage, the seat was left empty for 15 minutes. Then, a female passenger sat down for 15 minutes. Finally, the seat was left empty again for the rest 15 minutes. This test was to check whether the sensor at the seat could respond to successive changes in temperature. Please see FIG. 10.

TABLE 3

| Action of each stage | ΔV |
| --- | --- |
| *Just sitting down | $(0.119 - 0.00)/3.5 = (0.034 \pm 0.001)$ Vs$^{-1}$ |
| Sitting for 15 mins. | $(0.022 - 0.119)/900 = (-0.00011 \pm 0.00001)$ Vs$^{-1}$ |
| *Just standing up | $(-0.001 - 0.022)/1 = (-0.023 \pm 0.001)$ Vs$^{-1}$ |
| Standing up for 15 mins. | $(-0.001 - (0.000))/900 = (0.000001 \pm 0.00001)$ Vs$^{-1}$ |
| *Just sitting down | $(0.080 - 0.000)/2 = (0.040 \pm 0.001)$ Vs$^{-1}$ |
| Sitting for 15 mins. | $(0.021 - 0.080)/900 = (0.000065 \pm 0.000001)$ Vs$^{-1}$ |

TABLE 3-continued

| Action of each stage | ΔV |
|---|---|
| *Just standing up | $(-0.001 - 0.021)/1 = (-0.022 \pm 0.001)$ Vs$^{-1}$ |
| Standing up for 15 mins. | $((0.000) - (-0.001))/900 = (0.0000 \pm 0.0001)$ Vs$^{-1}$ |

Condition C

This experiment was to study the decay of voltage during a prolonged period of sitting by a passenger. The measurement lasted for 1 hour. In the first stage, the seat was occupied by a female passenger for 30 minutes. Then the seat was left empty for 30 minutes. The decay of voltage was monitored throughout the stages. Please see FIG. 11.

TABLE 4

| Action of each stage | ΔV |
|---|---|
| *Just sitting down | $(0.130 - 0.000)/3 = (0.043 \pm 0.001)$ Vs$^{-1}$ |
| Sitting for 30 mins. | $(0.022 - 0.130)/1797 = (0.00006 \pm 0.00001)$ Vs$^{-1}$ |
| *Just standing up | $(-0.002 - 0.022)/1 = (-0.020 \pm 0.001)$ Vs$^{-1}$ |
| Standing up for 30 mins. | $((-0.001) - (-0.000))/1799 \approx 0$ Vs$^{-1}$ |

Condition D

This experiment lasted for 30 minutes and had six stages. In the first stage, the seat was left empty for 5 minutes. In the second stage, the seat was occupied by a male passenger for 5 minutes. Then the seat was left empty for 5 minutes again. In the fourth stage, the seat was occupied by a female passenger again for 5 minutes. Then the seat was left empty for 5 minutes. Finally, the seat was occupied by a male passenger during the last 5 minutes. Please see FIG. 12.

TABLE 5

| Action of each stage | ΔV |
|---|---|
| Standing up for 5 mins. | $(0.000 - (-0.000))/300 = (0.000 \pm 0.000)$ Vs$^{-1}$ |
| *Just sitting down | $(0.130 - 0.000)/3 = (0.043 \pm 0.001)$ Vs$^{-1}$ |
| Sitting for 5 mins. | $(0.031 - 0.130)/300 = (-0.00033 \pm 0.00001)$ Vs$^{-1}$ |
| *Just standing up | $(-0.000 - 0.031)/1 = (-0.031 \pm 0.001)$ Vs$^{-1}$ |
| Standing up for 5 mins. | $((-0.001) - (-0.000))/300 = (0.000003 \pm 0.000001)$ Vs$^{-1}$ |
| *just sitting down | $(0.076 - (-0.001))/2 = (0.039 \pm 0.001)$ Vs$^{-1}$ |
| Sitting down for 5 mins. | $(0.038 - 0.076)/300 = (-0.00012 \pm 0.00001)$ Vs$^{-1}$ |
| *just standing up | $(0.000 - 0.038)/1 = (-0.038 \pm 0.001)$ Vs$^{-1}$ |
| Standing up for 5 mins. | $((-0.001) - (-0.000))/300 = (-0.000003 \pm 0.000001)$ Vs$^{-1}$ |
| *Just sitting down | $(0.080 - (-0.001))/2 = (0.041 \pm 0.001)$ Vs$^{-1}$ |
| Sitting for 5 mins. | $(0.034 - 0.080)/300 = (-0.00015 \pm 0.00001)$ Vs$^{-1}$ |

Condition E

In this experiment, the seat was occupied for one hour. This experiment served as a control to check the decay of voltage for a long occupation of the seat. The voltage was predicted to come to a steady value during the long occupation of seat as it came to a dynamic equilibrium of heat flow. Please see FIG. 13.

TABLE 6

| Action of each stage | ΔV |
|---|---|
| *Just sitting down | $(0.138 - 0.000)/3 = (0.039 \pm 0.001)$ Vs$^{-1}$ |
| Sitting for 60 mins. | $(0.02 - 0.138)/3597 = (-0.000033 \pm 0.000001)$ Vs$^{-1}$ |

Condition F

In this experiment, the seat was left empty for one hour. This experiment served as a control to check whether the sensor could have any change in voltage even when there was no occupancy. No voltage was generated under such conditions. Please see FIG. 14.

TABLE 7

| Action of each stage | ΔV |
|---|---|
| Standing up for 60 mins. | $(0.000 - 0.000)/3600 \approx 0$ Vs$^{-1}$ |

From the above experiments, it is shown that the present invention can be applied in a system for the detection of occupancy of a seat or seating in, for example, public transportation system. Thermoelectric material or thermoelectric sensors can be used in detection of sitting. The sensing means can thus be called as thermo-seat sensor. The detection makes use of thermoelectric generation or generator (TEG). The factors which would affect the performance of such a system include position of the TEG, the sensitivity of the TEG, the accuracy of the thermo-seat sensor, etc.

The above experiments have demonstrated the sensitivity of thermo-sensor for use in the context of a seat sensor. The sensitivity of the thermoelectric generator (TEG) is defined by $\Delta V/\Delta T$ and the sensitivity of the MARLOW TG 12-4L as demonstrated above is about 7 mV $°$ C.$^{-1}$. Typically, the temperature gradient between the thigh of a passenger and a seat is from about 15 to 20° C. Accordingly, the voltage generated would be about 105 to 140 mV. From the results, the voltage generated during sitting would be about 100 mV to 130 mV. That is exactly the values as shown in the experiments. The voltages generated when the sensors were touched by a finger were from ~4 to 10 mV which are small compared with the voltage generated when a passenger is sitting (about 100 mV). Both of the TEGs can precisely detect and respond to a fast action, e.g. just sitting down, just standing up, etc., indicating that the response time is fast enough for detection.

In the cases of knee and calf touching, the voltages generated were about 25-40 mV and 40-70 mV, respectively. These are larger values, although they are not as large when compared to the voltage generated during sitting. In other words, the system can still work and can determine whether a seat is occupied by a seating passenger or not.

When blowing air to the sensor, it was unexpectedly to give a large positive value of about 70 mV. It may be due to the hot air from expiration. Also the signal was not as larger as 80 mV, and thus the seat was not counted as occupied.

In this test, it was found that the thermo-sensor is very sensitive to wind. As the data shows, the value dropped when the wind blowing, which is because the heat is carried out from the seat by the air molecules. Indeed, it was not affecting the result seriously as it only dropped the voltage to about −9 mV with the gentle wind.

From the data, the voltages generated by the MARLOW TG 12-4L in most cases were higher than that of the TEC 12703, showing that the sensitivity of the MARLOW TG 12-4L to thermal change is higher. During the experiment, there was not much noise being detected by the MARLOW TG 12-4L while the fluctuation in TEC 12703 signal was detectable. The peak voltage generated in the MARLOW TG 12-4L was larger than that of the TEC 12703, indicating that with the same temperature gradient the MARLOW TG 12-4L would give a sharper and clearer signal than the TEC 12703.

In the time lag test of the two TEGs, there were almost the same response time. Therefore, both of them are reliable in detecting quick temperature change. It may be due to the good thermal conductivity of the ceramic plate of the sensor, so that the heat can be transferred quickly to the P-N junction in the TEG device.

To conclude, the MARLOW TG 12-4L is more sensitive and gives a fairly stable signal in temperature sensing. It is accurate enough to be used as the sensor of thermo-seat sensor.

In order to demonstrate the working of the thermo-seat sensor, the following explains the different conditions. There are six conditions in total. Please refer to the FIGS. 9 to 14, showing conditions A to F, respectively.

Condition A

FIG. 9 illustrates the change of voltage generated during a series of stages (events), referred as condition A. In this figure, it is shown that the voltage rose up sharply when the passenger just sat down. At this time, the maximum voltage reached was about 150 mV. Then the voltage dropped gradually to about 0.04 V within a few minutes. Then the voltage came to a dynamic equilibrium at about 20 mV eventually. The voltage decay from the time when the passenger had just sat down until the voltage had reached dynamic equilibrium was about 30 minutes. After the 30 minutes, the person stood up and the voltage dropped to zero rapidly within about 2 seconds. The change of voltage was fast when the person stood up. When the passenger sat down again, the voltage returned to 20 mV quickly and maintained at this level when the person sat down again. The voltage then dropped to about −5 mV when the passenger stood up and the seat was left empty. The voltage then returned to 0 mV over 15 minutes when the passenger stood up and left the seat. The voltage then increased sharply to about 100 mV when another passenger sat down. A significant change in voltage was caused when another passenger occupied the seat. The voltage then decayed to about 20 mV again. When this other passenger left the seat, the voltage initially dropped to −5 mV. After some time the voltage returned to 0 mV.

These results demonstrate that the system was able to detect the present or absence seat occupancy accurately and reliably.

Condition B

Figure 10:
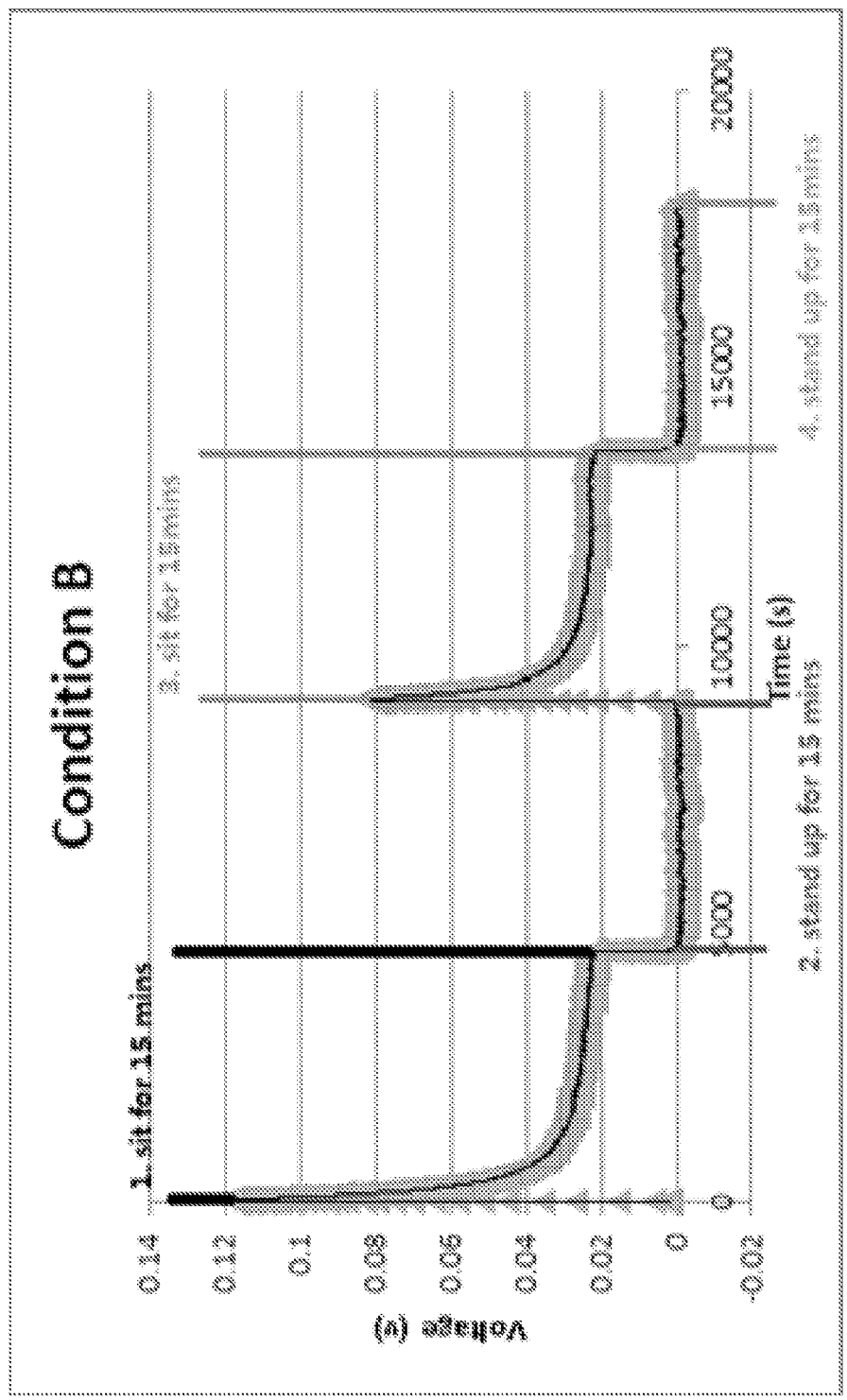

FIG. 10 illustrates the change of voltage generated during a series of stages, referred as condition B. When a passenger first sat down, the voltage rose up to about 120 mV within 3 seconds and then decayed to a dynamic equilibrium of 20 mV. Then when the passenger stood up, the voltage dropped to around zero (−1.0±0.5 mV) within one second. The change in voltage pattern was similar in the third and fourth stages, as shown in FIG. 10. It is however to be noted that the value of voltage induced initially at stage 3 is not as large as in stage 1. It may be due to the fact that the thermo-sensor in the earlier stage at the beginning of stage 3 had already been warmed up. Therefore, the temperature gradient is not as large as before.

From these results, the voltage induced by a passenger sitting on the seat should be 80 mV or higher. The change in voltage when a passenger has just sat down should be at least 30 mVs$^{-1}$. The change in voltage when a passenger has just stood up should be about −20 mVs$^{-1}$.

Condition C

Figure 11:
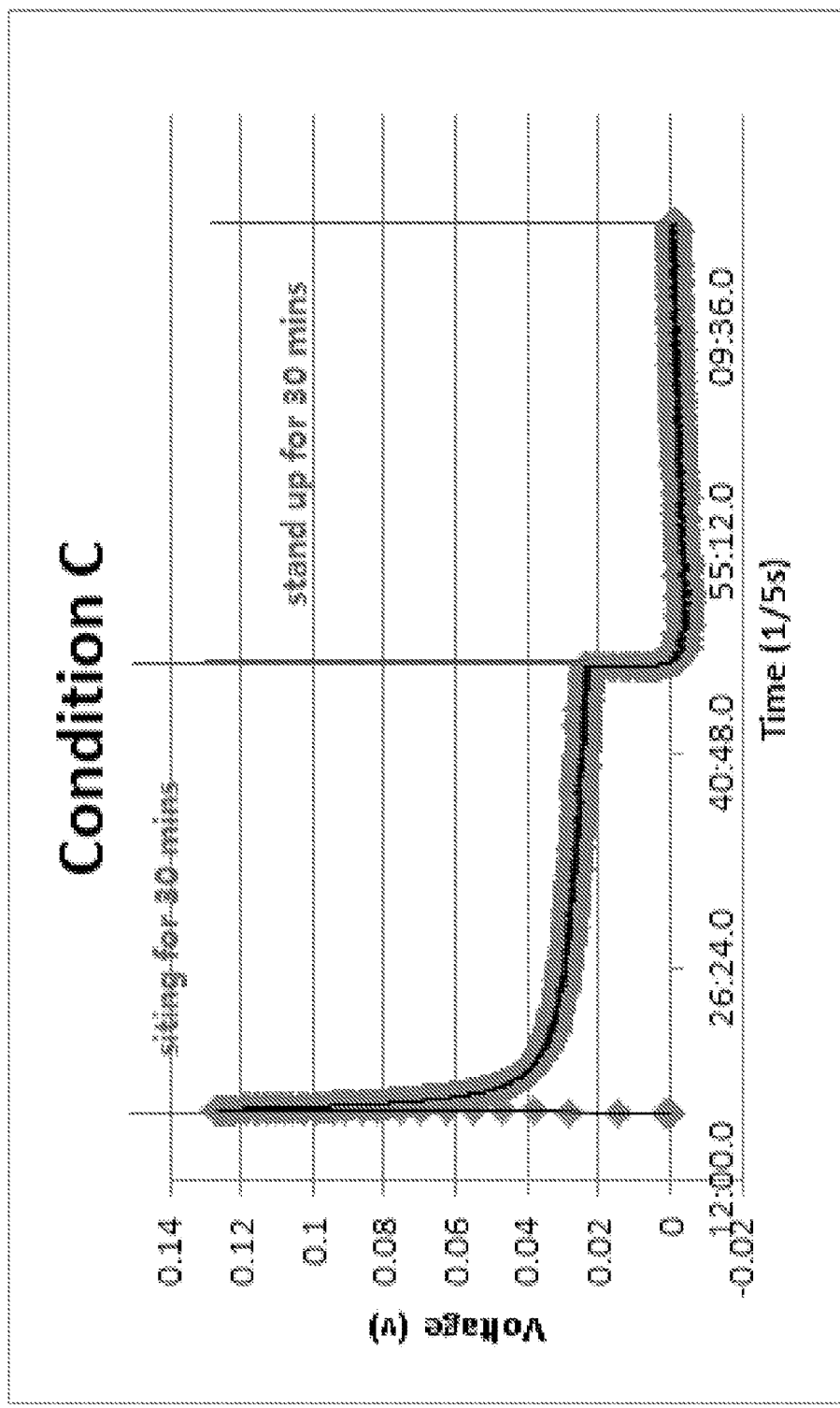

FIG. 11 illustrates the change of voltage generated during a series of stages, referred as condition C. In this condition, the seat was occupied for half an hour and then left empty for the following half an hour. This experiment was to study the behavior of voltage decay when the seat was continuously occupied by a passenger for half an hour. As shown in FIG. 11, when a passenger had just sat down the voltage went up to 130 mV within 3 seconds and the change in voltage was about 43±1 mVs$^{-1}$. The change is clearly sharp and detectable. Then the voltage decayed to about 21 mV within 15 minutes. This is close to the dynamic equilibrium value of the induced voltage as the generated voltage became flattened. That means the voltage generated or the sensor on the seat would reach to a dynamic equilibrium when the seat had been occupied for about 30 minutes. When the seat sensor came to a dynamic equilibrium after 15 minutes, the induced voltage did not drop further but maintained at about 20 mV. With this voltage pattern the seat can be identified as occupied if the voltage generated is maintained at around 20 mV. When the person stood up after 30 minutes, the induced voltage dropped almost 0 to −1 mV. This change is sharp, and can be identified as the seat being unoccupied. The voltage generated during the next 30 minutes was 0 mV—this indicating that the seat was not occupied.

Condition D

Figure 12:
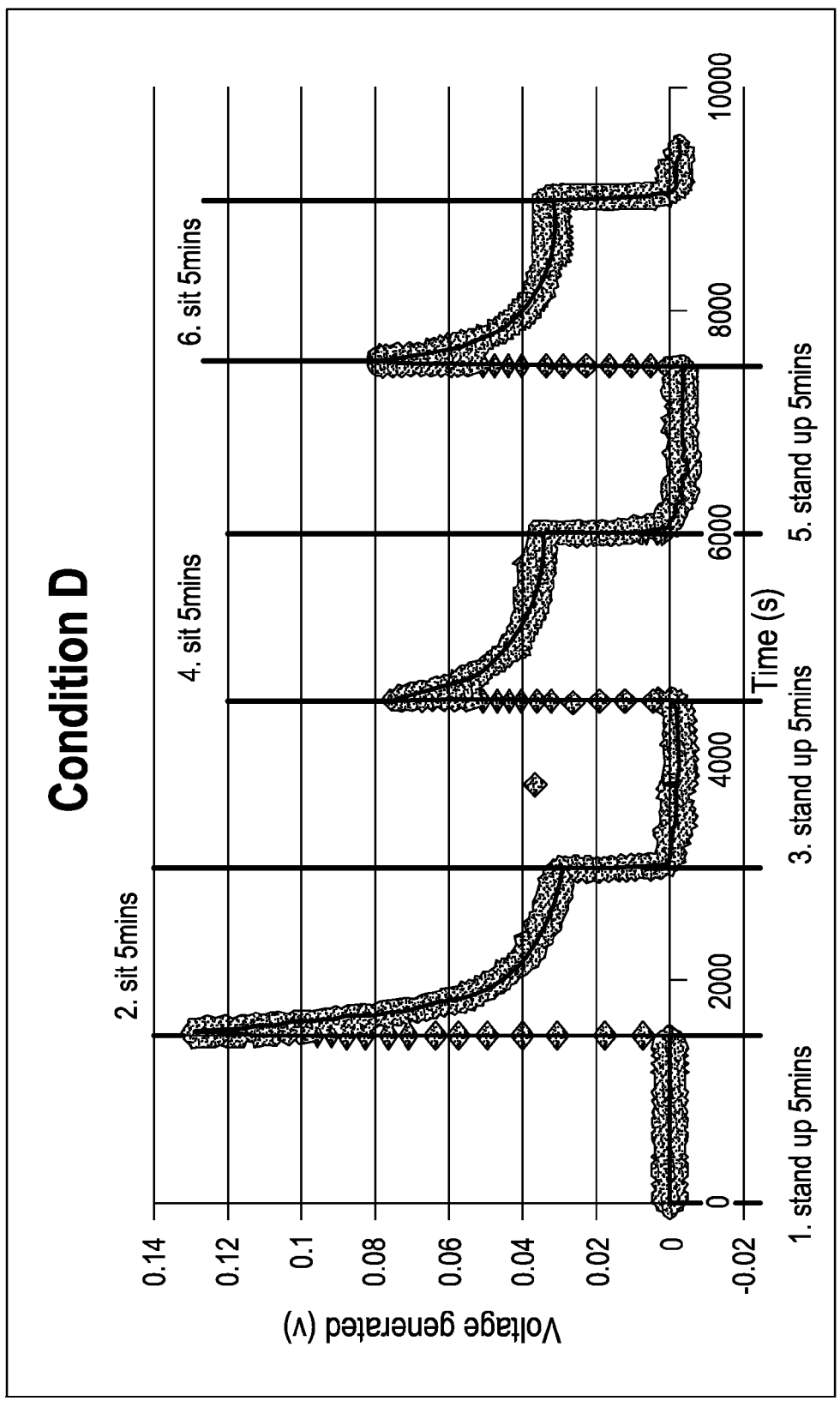

FIG. 12 illustrates the change of voltage generated during a series of stages, referred as condition D. FIG. 12 shows that the voltage generated for the first five minutes was zero, when the seat was left empty (stage 1). The voltage then rose sharply from 0 mV to about 130 mV within 3 seconds when a passenger sat down (stage 2). Then the voltage generated decayed from 130 mV to 30 mV over a period of 5 minutes. At the end of the 5 minutes, the seat was left empty and the voltage generated dropped to 0 mV. The pattern during successive stages was generally similar to the initial stages. However, the voltage generated initially when a passenger just sat down (stage 4) was smaller when compared with that at stage 2. It may be due to the seat sensor at the subsequent stages having been warmed up already. In any event, the change in voltage of at least 30±1 mVs$^{-1}$ is clearly detectable or noticeable.

Condition E

Figure 13:
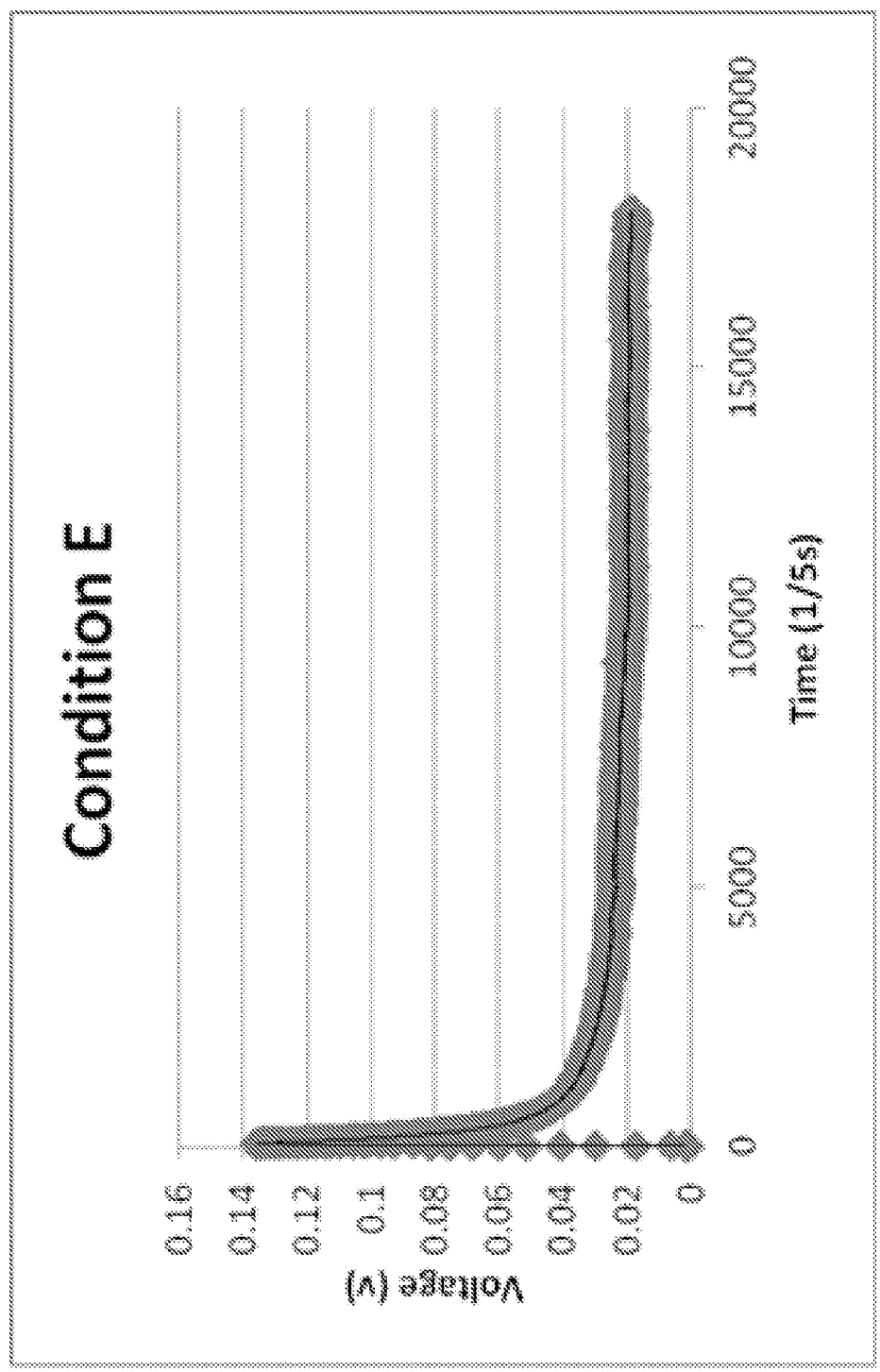

FIG. 13 illustrates the change of voltage generated during a series of stages, referred as condition E. In this condition, the seat was continuously occupied for one hour. This experiment was performed to simulate the voltage inducted over a long period of seat occupancy. FIG. 13 shows that after a passenger had sat down, the maximum voltage would reach about 140 mV within a short period of time, and then the voltage dropped or decayed to 20 mV within about 16 minutes. It is to be noted that there was not any sudden change in voltage after the initial voltage spike. The initial change of voltage when the person had just sat down was about 39±1 mVs$^{-1}$, which is sharp enough to be identified as a seat occupation. The subsequent change of voltage after the voltage had reached the maximum value of 140 mV was −0.0033±0.0001 mVs$^{-1}$ which is relatively very small. These results indicate that the time for the seat sensor to reach a (voltage) dynamic equilibrium is about 16 minutes and the voltage at dynamic equilibrium is about 20 mV. At this voltage, the thermoelectric sensor can be adapted to identify that the seat is being occupied.

Condition F

Figure 14:
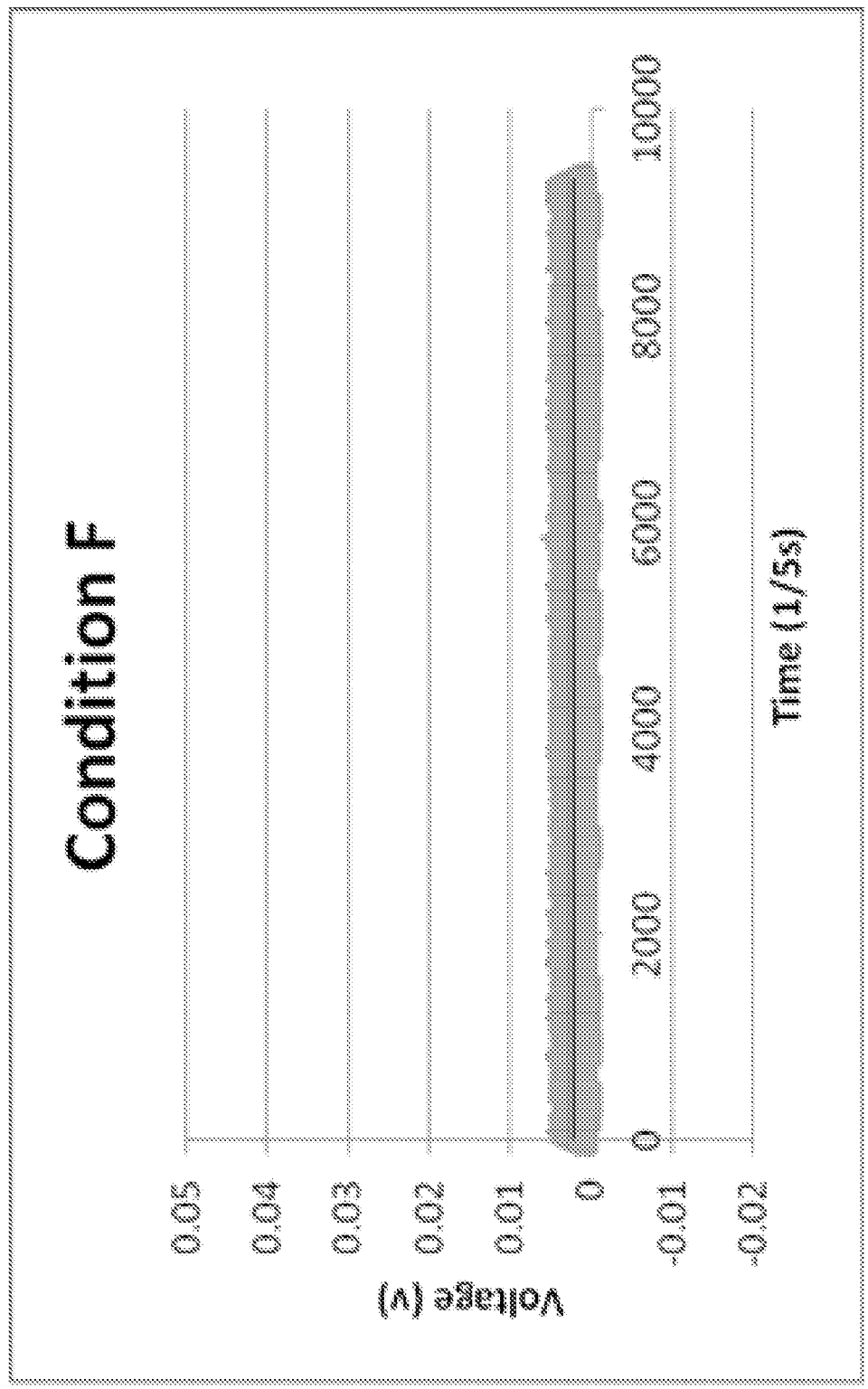
Figure 15:
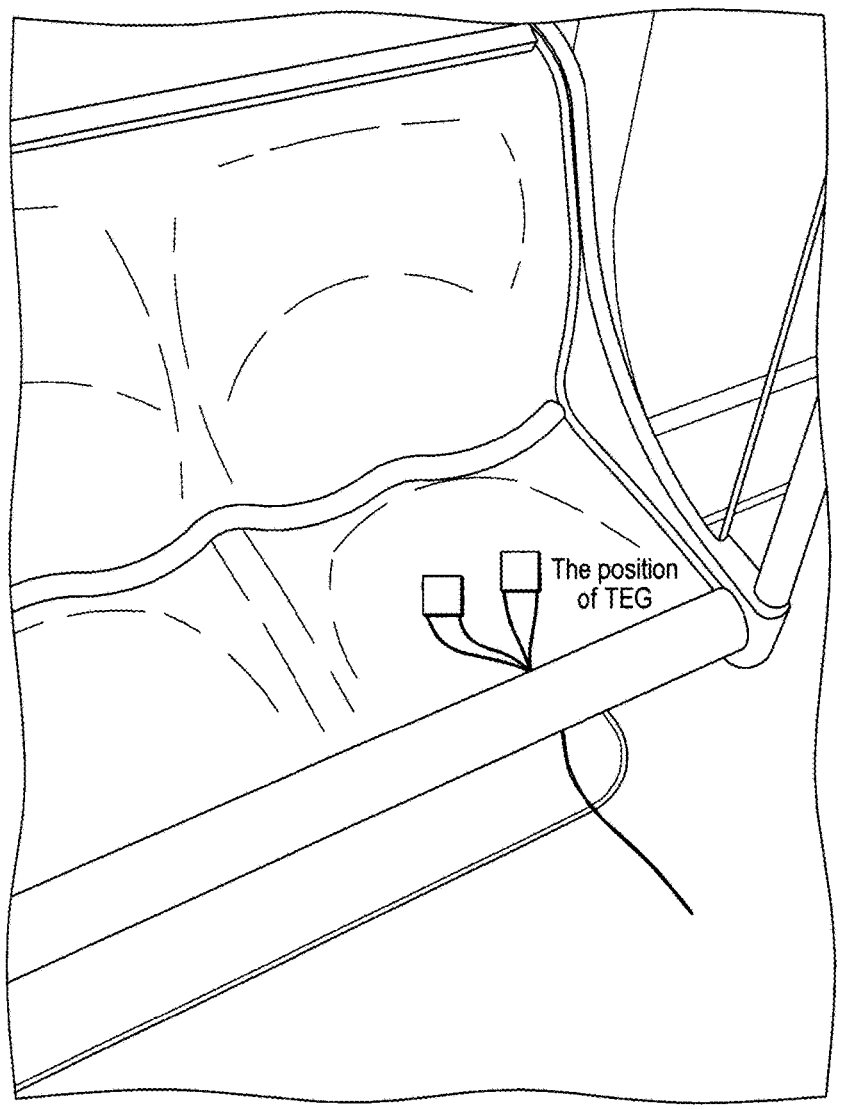
FIG. 15 is a photograph showing arrangement of two sensors placed on a seat surface in a public transportation vehicle for detecting temperature gradient.

FIG. 14 illustrates the change of voltage generated when a seat provided with a thermoelectric sensor is left empty, referred as condition E. FIG. 14 shows that there was no change in voltage when there was no person sitting on the seat. This result shows that there was basically no voltage generated from the seat sensor. In this condition, the seat sensor would indicate that the seat be available. Although some fluctuations in voltage are shown in FIG. 14, this fluctuation is very slight, possibly due to background noises such as wind and air circulation above the seat.

With the data generated from the above experiments, a system for detecting the presence or absence of a heat emitting object for example on a passenger seat or occupancy status of the seats in a vehicle can be designed. The parameters for the detection can be defined. For example, the change in voltage when the seat is being occupied is larger than 20±1 mVs$^{-1}$ (positive value) and the range of induced voltage is from about 80±1 mV to 160±1 mV (positive value). With these values detected, the seat can be determined as occupied.

The change in voltage when a passenger is just standing up is at least 20±1 mVs$^{-1}$ (negative value), and the voltage induced is around −3.0±0.1 mV. When this occurs, the seat can be determined as unoccupied. Some conditions, such as when mobile phone placed on a seat, knee or calf touching a seat, etc. would generate similar conditions. However, these induced voltages are significantly lower. When these values are detected, the seat can be determined as unoccupied. In any event, to minimize erroneous identification, two thermoelectric sensors may be installed on a seat. More specifically, the two sensors can be arranged on a location of the seat such that both thighs of a passenger would be in contact with the two sensors, respectively. Only when the values registered by the two sensors are in agreement would the system yield an indication of being occupied.

A system for the detection of the occupancy status of the seating in a transportation system may require calibration in different environmental conditions. This is because the temperature of the seating in the winter season and the summer season are different. Accordingly, the voltage generated or the change of voltage over time can differ. In order to reduce complications arising from the environmental condition, means for calibrating the system may be needed. For example, it is envisaged that in winter season, the voltage generated when a passenger has just sat down would be larger, since the thermal gradient between the passenger and the seat would be larger. The calibration would need to factor this into consideration. Further, in order to ensure that there is minimal lag (response) time when there is a change in status of the seat, the seat sensor should be arranged to be very close to the seat surface, so as to enhance the heat flow between the seat sensor and the sensor. The system should also be adapted to take into consideration of about 1% instrumental error.

The detection of seat occupancy status relies on the thermoelectric signal from the thermoelectric generating (TEG) plate and a constant heat flow between the passenger and the seat. In order to ensure heat flow between the passenger and the seat, a sink can be placed at the cold side of the TEG plate, so that the temperature gradient can be maintained. The heat sink can improve the sensitivity of the TEG plate by dissipating heat faster after a sitting passenger has left the seat. With this arrangement, the response time, or lag time, can be reduced.

A sharp change of the temperature of the seat is a major parameter that the system can make use to determine whether the seat is occupied or not. In other words, the thermal conductivity of the seat affects the sensor's lag time for response and its sensitivity. When the seat is made of material with good thermal conductivity, heat can flow from the passenger's hip to the seat efficiently and quickly so as to generate a faster electrical signal. The use of a seat made of material with good thermal conductivity can also reduce the lag time of and increase the reliability of the system. A more efficient thermoelectric material can also improve the detection precision. In other words, the higher the electrical signal generated with a small temperature change, the more precise the detection it is.

In a sensing system which would be affected by noise arising from wind induced voltage generation, suitable means for calibration of the system would be needed. Specifically, the calibration is adapted to ignore voltage corresponding to the magnitude of voltage induced by wind. Parameters used by the calibration means can be ascertained by testing the voltage generated on a particular TEG as a result of wind.

In practical application, an amplifying circuit may be used to recognize very small signal and thus thermo-seat sensors made of any sufficiently good thermoelectric materials could be used for thermo-seat sensors integrated with the amplifying circuit.

As shown above, a system provided with a thermoelectric sensor or thermo-seat sensor can accurately detect the occupancy status of a seat or the seating in the system. With such a system, signals arising from the detection can be fed to a display means, e.g. a visual display. The display means may be installed on the exterior of for example a subway train with multiple cabins. The display means with occupancy information of the multiple compartments can guide prospective passengers to go the compartments with more unoccupied seats. Alternatively, the system can be installed on a double-decker bus, and passengers can check with the display means on whether the upper-deck has empty seats or not before going up to the upper deck to check for themselves.

The system can be applied in private passenger cars for example for safety application. In such application, similar thermoelectric sensors are installed on the seats. The sensors are installed for determining whether air bags or which air bags are to be deployed in case of an accident. For example, when the sensors have detected the present of passengers at the rear seats, only the air bags for the rear passenger compartments would be deployed in an accident; and the passenger air bags in the front would not be deployed. The system can also be designed such that it can determine whether a seat is occupied by an adult or a child. This other design can be adapted such that the air bag is deployed with an appropriate angle of deployment in order to better protect the passenger (adult or child) in an accident.

While the present invention can be applied in a system for sensing the presence or absence of a passenger on a seat or the occupancy in the cabin in a vehicle, the present invention can also be applied in other contexts. For example, the present invention can be applied in a washroom facility. Similar thermoelectric sensors may be installed for example on toilet seats or urinals in a washroom facility for the detection of the occupancy status of the facility. Prospective users of facility can learn the occupancy status of a particular washroom from a distance. If a particular washroom is full s/he can choose another washroom for use. The signals generated from the detection can also be used for general switching and control, for example, flushing at an appropriate time.

The present invention can also be applied for ensuring safety of cooking gas supply in for example a domestic dwelling. In such application, an appropriate thermoelectric sensor is installed near the cooking stove. When cooking gas flows there should be a corresponding increase in temperature surrounding the cooking stove. Means is provided to monitor the relationship of gas flow and temperature increase (thermal gradient). When an abnormality is detected, for example, when there is a flow of gas but no positive heat flow to the surrounding, this is indicative of a gas leak. The monitoring means can then step in and cease the supply of gas by activating a safety valve to ensure safety. In other words, the present invention can also be applied in the context of general switching and safety control of a gas supply system.

In the aforementioned embodiment of washroom facility or cooking gas supply system, a system for signal switching and control can be operatively coupled to the washroom facility or cooking gas supply. Such a signal switching and control can broadly apply to other switching and control systems.

It should be understood that certain features of the invention, which are, for clarity, described in the content of separate embodiments, may be provided in combination in a single embodiment. Conversely, various features of the invention which are, for brevity, described in the content of a single embodiment, may be provided separately or in any appropriate sub-combinations. It is to be noted that certain features of the embodiments are illustrated by way of non-limiting examples. Also, a skilled person in the art will be aware of the prior art which is not explained in the above for brevity purpose.

The invention claimed is:

1. A sensing system of detecting presence or absence of a heat emitting person, the heat generated external to the system, comprising a platform configured to receive the person, the platform defining an area in which a temperature gradient with the person exists, a thermoelectric sensor placed at a position of the platform such that in use the thermoelectric sensor is in physical or thermal contact with the person for generating an electrical voltage indicative of the presence or absence of the temperature gradient and/or the magnitude of the temperature gradient, an indicator for indication of the presence or absence of the person to be detected and a data logger for recording signals and data generated by the thermoelectric sensor, wherein an increase of electrical voltage at the thermoelectric sensor is indicative of an increasing temperature gradient thus the presence of the person and a decrease of electrical voltage at the thermoelectric sensor is indicative of a decreasing temperature gradient thus the absence of the person whereby detection of presence or absence of the person is based on change of temperature; and wherein:—
the thermoelectric sensor includes one p-n diode or an array of p-n diodes, and the diode(s) is/are adapted to convert thermal power from the heating emitting object to electrical power for signal generation, whereby heat energy from the heat emitting person is converted to electrical energy and thus the electrical voltage; and
the thermoelectric sensor is configured to detect the change of temperature with a predetermined lag time and a threshold of the temperature gradient.

2. A system as claimed in claim 1, comprising a power amplifier for amplifying signals generated by the thermoelectric sensor.

3. A system as claimed in claim 1, comprising a non-transitory computer readable medium loaded with computer program for processing data generated by the thermoelectric sensor for ascertaining the presence or absence of temperature gradient and/or the magnitude of the temperature gradient, and determining the presence or absence of the object.

4. A system as claimed in claim 1, wherein the sensor comprises the use of a thermal electric generator made of a thermoelectric material.

5. A system as claimed in claim 1, wherein the electrical voltage generated by the thermoelectric sensor ranges from substantially 4 mV to 70 mV.

6. A system as claimed in claim 1, wherein the system is a public washroom facility system.

7. A system as claimed in claim 6, wherein the platform is a toilet seat of a toilet bowl in the public washroom facility system, and the sensor is arranged at a location of the toilet seat with which a user is in thermal contact in use, thus creating a temperature gradient between the user and the toilet seat.

8. A system as claimed in claim 6, wherein the platform is a urinal, and the sensor is arranged at a location of the urinal with which a user or excretion from the user is in thermal contact in use, thus creating a temperature gradient between the user or the excretion and the urinal in use.

9. A signal switching and control system coupled with a sensing system as claimed in claim 1.

10. A method for detecting presence or absence of an object emitting heat, comprising the steps of:
a) providing a platform for receiving the object, the platform defining an area in which a temperature gradient with the object exists; and
b) providing a thermoelectric device for generating an electrical voltage indicative of presence or absence of temperature gradient and/or the magnitude of the temperature gradient; wherein
the heat is generated from the heat emitting object and external to the platform or thermoelectric device;
an increase in electrical voltage at the thermoelectric device is indicative of an increasing temperature gradient thus the presence of the heat emitting object and wherein a decrease in electrical voltage at the thermoelectric device is indicative of a decreasing temperature gradient thus the absence of the heat emitting object, whereby detection of presence or absence of the person is based on change of temperature;
the thermoelectric device includes one p-n diode or an array of p-n diodes, and the diode(s) is/are adapted to convert thermal power from the heating emitting object to electrical power for signal generation, whereby heat energy from the heat emitting person is concerned to electrical energy and thus the electrical voltage; and the thermoelectric sensor is configured to detect the change of temperature with a predetermined lag time and a threshold of the temperature gradient.

11. A sensing system for detecting presence or absence of a heat emitting object with the heat generated external to the sensing system, comprising a platform for receiving the heat emitting object, the platform defining an area in which a temperature gradient with the object exists, a thermoelectric device acting as a sensor and placed at a position in the platform such that in use the thermoelectric device is in physical contact or at least thermal contact with the heating emitting object for generating an electrical voltage indicative of the presence or absence of the temperature gradient and/or the magnitude of the temperature gradient, an indicator for indication of the presence or absence of the heat emitting object to be detected; wherein an increase of electrical voltage at the thermoelectric device is indicative of an increasing temperature gradient thus the presence of the object emitting heat and a decrease of electrical voltage at the thermoelectric device is indicative of a decreasing temperature gradient thus the absence of the object emitting heat, whereby detection of presence or absence of the person is based on change of temperature; and the thermoelectric device includes one p-n diode or an array of p-n diodes, and the diode(s) is/are adapted to convert thermal power from the heating emitting object to electrical power for signal generation, whereby heat energy from the heat emitting person is concerned to electrical energy and thus the electrical voltage; and the thermoelectric sensor is configured to detect the change of temperature with a predetermined lag time and a threshold of the temperature gradient.

12. A sensing system as claimed in claim 11, further comprising means for logging signals and data generated by the sensor and/or the thermoelectric device, wherein:
the thermoelectric device includes one p-n diode or an array of p-n diodes, and the diode(s) is/are adapted to convert thermal power to electrical power for signal generation.

* * * * *